United States Patent [19]

Dydyk

[11] 4,143,334
[45] Mar. 6, 1979

[54] MICROWAVE/MILLIMETER WAVE OSCILLATOR

[75] Inventor: Michael Dydyk, Scottsdale, Ariz.

[73] Assignee: Motorola Inc., Schaumburg, Ill.

[21] Appl. No.: 887,142

[22] Filed: Mar. 16, 1978

[51] Int. Cl.² ............................................. H03B 7/14
[52] U.S. Cl. ....................................... 331/56; 331/101
[58] Field of Search ...................... 330/56; 331/56, 96, 331/101, 107 R, 107 G, 107 T

[56] References Cited

U.S. PATENT DOCUMENTS

| 4,031,486 | 6/1977 | Havens | 331/96 |
| 4,034,314 | 7/1977 | Dydyk | 331/56 |
| 4,075,578 | 2/1978 | Dydyk | 331/56 |
| 4,090,152 | 5/1978 | Dydyk | 331/56 |

*Primary Examiner*—John Kominski
*Attorney, Agent, or Firm*—Eugene A. Parsons

[57] ABSTRACT

In an oscillator of the type producing microwaves, millimeter waves and above, apparatus and a method for increasing the size, so that one or more active devices can be coupled to the oscillator, including a first cavity operating at a higher order mode, which cavity has an output coupled thereto for removing power, and a second cavity operating at a dominant mode and coupled to the first cavity, which second cavity assures efficient and spurious-free operation of the oscillator at the desired frequency.

15 Claims, 5 Drawing Figures

MICROWAVE/MILLIMETER WAVE OSCILLATOR

BACKGROUND OF THE INVENTION

Oscillators constructed to operate in frequencies of microwave, millimeter wave and above are extremely small and it is extremely difficult to couple one or more active devices thereto. In fact, oscillators in the millimeter wave frequency range are so small it is difficult to couple a single active device, such as an IMPATT diode, thereto. Even for oscillators operating in the microwave range it is difficult to couple a plurality of active devices to the oscillator to obtain higher output power levels. A typical prior art microwave oscillator including apparatus for utilizing a plurality of active devices to improve the power output, is illustrated and described in U.S. Pat. No. 4,034,314, entitled "Microwave Diode Coaxial Circuit Oscillator Improvement", issued July 5, 1977 and assigned to the same assignee. Because of the small size of the resonant cavities in the prior art devices, the number of active devices which may be utilized to increase the power output is severely limited.

Also in the prior art, an attempt was made to increase the size of the resonant cavity by operating the cavity in a higher order mode. In doing this, other undesirable resonances appear below and above the operating frequency. These resonances will generate spuriour responses. To suppress these resonances this prior art structure utilizes absorptive filters to reduce the Q of the undesirable resonances. Unfortunately, this approach also reduced the Q of the desired resonance, resulting in an inefficient oscillator.

SUMMARY OF THE INVENTION

The present invention pertains to oscillatory apparatus for frequencies on the order of microwave, millimeter wave and above including a first resonant cavity tuned to have a higher order mode of operation at a predetermined frequency, a second resonant circuit tuned to operate in the dominant mode at the predetermined frequency and one or more active devices coupled to the resonant cavities for controlling oscillations therein to the predetermined frequency. Because the first cavity is operating at a higher order mode, it is larger than it would be if it were operating at the dominant mode and, hence, there is greater space for coupling additional active devices thereto.

Operating a cavity in a higher order mode resonance presents complications of having to deal with other undesirable resonances. Suppression or preventing proper oscillatory conditions at these undesirable resonances is essential due to the active device' better than octave bandwidth, negative resistance characteristics.

It is an object of the present invention to provide oscillatory apparatus for frequencies on the order of microwave, millimeter wave and above with a greater size so that one or more active devices can be more easily coupled thereto and that will guarantee operation at the desired frequency without loss in efficiency.

It is a further object of the present invention to provide oscillatory apparatus for frequencies on the order of microwave, millimeter wave and above which are easier to construct and which can be constructed with additional active devices for higher power output with each active device being included in apparatus with independent control to thereby provide means to compensate for differences in active device characteristics, making the overall apparatus more efficient and easier to tune on frequency.

These and other objects of this invention will become apparent to those skilled in the art upon consideration of the accompanying specification, claims and drawings.

BRIEF DESCRIPTION OF THE DRAWINGS

Referring to the drawings.

DESCRIPTION OF THE PREFERRED EMBODIMENTS

Figure 1:
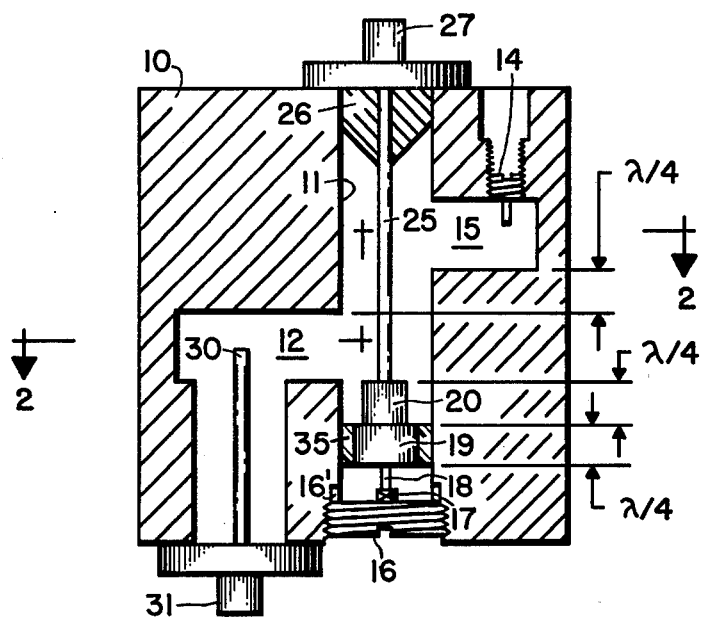
FIG. 1 is a cross-sectional view of an oscillator embodying the present invention.
Figure 2:
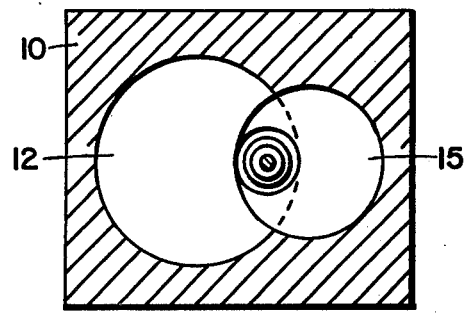
FIG. 2 is a sectional view as seen from the irregular line 2—2 in FIG. 1.

Referring specifically to FIGS. 1 and 2, the numeral 10 indicates a housing having an elongated cylindrically shaped opening 11 formed therethrough with a first generally cylindrically shaped cavity 12 and a second generally cylindrically shaped cavity 15 formed in communication therewith. The axis of the opening 11 and the cavities 12 and 15 are parallel but spaced apart so that the opening 11 extends through the cavities 12 and 15 and, in this embodiment, is generally tangent to the outer wall of each of said cavities (see FIG. 2). The housing 10 and the various parts described herein may be constructed of electrically conducting material or simply coated to provide the required conduction, as is well known to those skilled in the art.

A plug 16 is threadedly engaged in one end of the opening 11 to seal the one end. The plug 16 may provide an adjustable feature (such as a tubularly shaped spacer 16') to adjust the length of the opening 11 and the spacing between the end thereof and the cavity 12, if desired. An active device 17, which may be for example a negative resistance diode such as an IMPATT diode or the like, is mounted with one end physically and electrically connected to the plug 16. The opposite end of the device 17 is connected through a three step (in this embodiment) equalizing network, designated 18, 19 and 20, and a coaxially positioned rod 25 to a matching load termination 26. The rod 25 actually extends through the load termination 26 to the center contact of a bias input terminal 27 external to the housing 10. The input terminal 27 is designed to have a bias source (not shown) attached thereto for biasing the active device 17 into the desired operating region. The opening 11 and rod 25 operate as a section of coaxial line with the equalizing network operating to couple the active device 17 to the coaxial line with the correct impedance. The section 20 of the equalizing network is connected to the rod 25 approximately in the plane of the lower wall (in FIG. 1) of the cavity 12. A probe 30 extends from the center conductor of an output terminal 31 through an opening in the housing 10 into the cavity 12. The probe 30 is provided to remove power from the cavity 12 at the desired frequency. The output power can also be extracted with the same coupling mechanism as used in the coaxial/active device module, described in U.S. Pat. No. 4,075,578, issued Feb. 21, 1978 and assigned to the same assignee.

While the opening 11, forming the outer conductor of the section of coaxial line, is illustrated as generally tangent to the outer walls of the cavities 12 and 15, it should be understood that this relationship will vary with the amount of coupling required. The amount of coupling between each of the cavities 12 and 15 and the section of coaxial line is a function of the distance between the axis of each of cavities 12 and 15, respectively, and the center conductor, rod 25, of the section of coaxial line.

Figure 3:
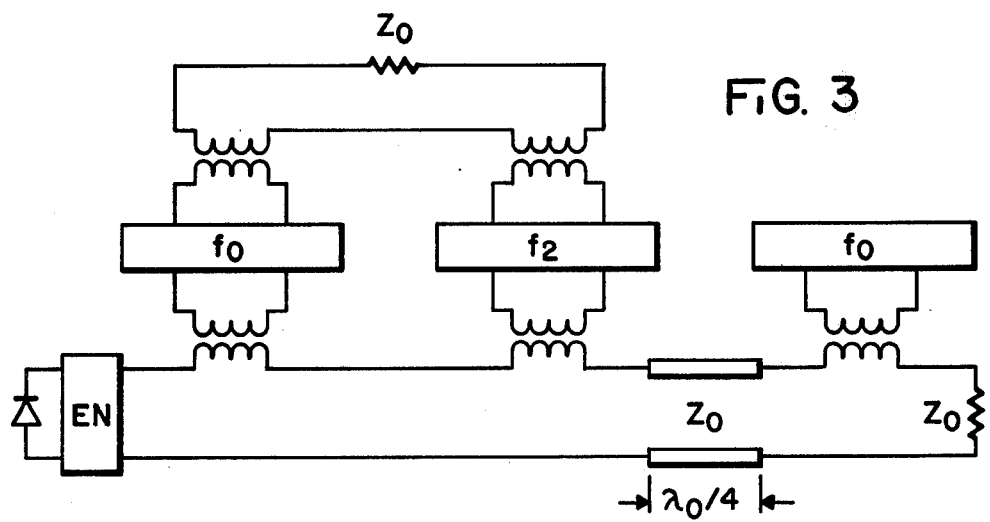
FIG. 3 is an equivalent circuit for the oscillator of FIG. 1.

The first cavity 12 is designed to operate at a specific, or predetermined, frequency in a higher order mode (i.e., $TM_{ono}$, where n is a digit greater than 1.). By designing the cavity 12 in this way an additional complication is introduced, i.e., other resonances (both below and above the desired frequency) within an octave band frequency range as illustrated in the equivalent circuit of FIG. 3. It should be understood that the resonant circuit, or resonant cavity 12, could have many more resonances but two are illustrated for purposes of this explanation. In general, the cavity 12 will have a dominant mode and one or more higher order modes.

The second cavity 15 is a resonant circuit with a dominant mode and may have higher order modes, but they will be high enough in frequency to have no effect on the oscillator. A tuning element 14 is provided for tuning the cavity 15 to the desired resonance. The dominant mode of the resonant cavity 15 is the frequency of oscillation of the apparatus and is the same frequency as the frequency of the higher order mode at which the cavity 12 is designed to operate. The plane containing the upper surface of the cavity 12 and the plane containing the lower surface of the cavity 15 are parallel and spaced apart a distance equal to one-quarter wavelength of the operating frequency of the oscillator. Because the cavity 15 is resonant at the operating frequency it is a very high impedance and the quarter wavelength section of coaxial line presents a virtual short circuit to the operating frequency at the upper surface of the cavity 12.

The equalizing network is constructed so that the circuit, looking into the active device 17 from the lower wall of the cavity 12, looks like a pure negative resistance and the circuit, looking into the cavity 12 from the equalizing network, looks like a purely real resistance. Also, the equalizing network is designed so that the impedance seen by the active device 17 is directly proportional to the loading of the cavities 12 and 15. Because the active device 17 will lock onto the frequency at which there is the most gain, under the above described circumstances the active device 17 will lock onto the frequency controlled by the second cavity 15, since the cavity 15 is not loaded and provides minimum real impedance when combined with the ¼ transmission line. In the present embodiment, the above described requirements are met by constructing the equalizing network with three sections, 18, 19 and 20, but it should be understood that these requirements could be met with many other embodiments known to those skilled in the art. Section 18 is constructed to resonate out the reactance of the active device 17 (the length of section 18 is a function of the reactance of the device 17) and each of the sections 19 and 20 are constructed one-quarter wavelength at the operating frequency. A tubular section 35 of dielectric material is placed between the transformer section 19 and the wall of the housing 10 to support the equalizing network in the opening 11.

Figure 4:
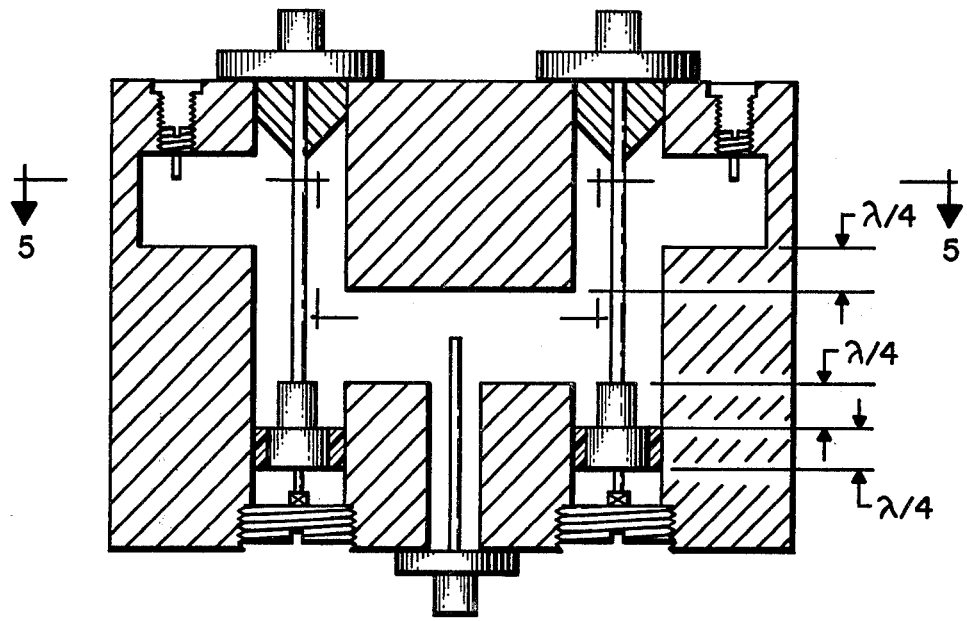
FIG. 4 is a sectional view similar to FIG. 1 of an embodiment including a plurality of active devices.
Figure 5:
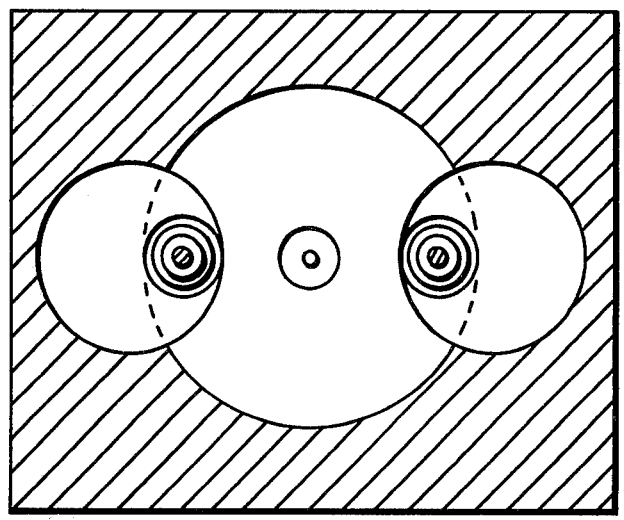
FIG. 5 is a sectional view as seen from the irregular line 5—5 in FIG. 4.

Thus, the cavity 15, which operates in its dominant mode, controls the frequency of the oscillator and the cavity 12 is operated in a higher order mode so that it is large enough to realize a single or N active device oscillator without introducing spurious oscillations or reducing efficiency. If additional active devices are desired to increase the power output, FIGS. 4 and 5 illustrate an embodiment for accomplishing this feature. Basically, the structure illustrated in FIGS. 4 and 5 is similar to the structure illustrated in FIGS. 1 and 2 except that an additional active device, along with a coaxial section and another dominant mode cavity, is added. It should be understood that additional active devices and associated circuitry can be added if desired. The number of active devices which can be added is dependent upon the size of the cavity operating in the higher order mode and it will be recognized by those skilled in the art that many additional active devices and, therefore, a substantial amount of output power can be added by operating the common cavity at a higher order mode.

While I have shown and described specific embodiments of this invention, further modifications and improvements will occur to those skilled in the art. I desire it to be understood, therefore, that this invention is not limited to the particular forms shown and I intend in the appended claims to cover all modifications which do not depart from the spirit and scope of the invention.

What is claimed is:

1. Oscillating apparatus for frequencies on the order of microwave, millimeter wave and above, comprising primary oscillatory circuitry including an active device coupled into said circuitry for sustaining oscillations therein and a first resonant circuit tuned to have a higher order mode of operation at a predetermined frequency, a second resonant circuit tuned to operate at the predetermined frequency and coupled to said primary oscillatory circuitry for controlling oscillations therein to the predetermined frequency, and output means coupled to said first resonant circuit for removing power therefrom at the predetermined frequency.

2. Oscillatory apparatus as claimed in claim 1 wherein the active device is a negative resistance device.

3. Oscillatory apparatus as claimed in claim 2 wherein the active device is a semiconductor diode.

4. Oscillatory apparatus as claimed in claim 1 wherein the first and second resonant circuits are resonant cavities formed from sections of transmission lines.

5. Oscillatory apparatus as claimed in claim 1 wherein the second resonant circuit is constructed to operate in a dominant mode of operation.

6. Oscillatory apparatus as claimed in claim 1 wherein the active device is coupled to the first and second resonant circuits by means including an equalizing network constructed so that the impedances of the first and second circuits at the active device are directly proportional to the loading of the first and second circuit, respectively.

7. Oscillatory apparatus as claimed in claim 1 wherein the first resonant circuit is a cavity and the output means includes a probe extending into the first cavity at a point spaced from the center of the first cavity.

8. Oscillatory apparatus as claimed in claim 1 wherein the means coupling the active device to the first and second circuits further includes a section of coaxial line.

9. Oscillatory apparatus as claimed in claim 8 wherein the active device is mounted adjacent one end of the coaxial line, the first circuit is connected to said coaxial line at a distance determined by the equalizing network, and the second circuit is connected to said coaxial line at a distance from said first circuit equal to N one-quarter wavelengths of the predetermined frequency, where N is an odd integer.

10. Oscillatory apparatus as claimed in claim 9 wherein a plurality of active devices are coupled to the first circuit by a plurality of coaxial lines and to a plurality of second circuits by said plurality of coaxial lines.

11. Oscillatory apparatus as claimed in claim 1 wherein the primary oscillatory circuitry includes a plurality of active devices.

12. Oscillating apparatus for frequencies on the order of microwave, millimeter wave and above, comprising:
 (a) an active device having a negative resistance region of operation;
 (b) a first resonant cavity designed to operate in a higher order mode of operation at a predetermined frequency within the region of operation of said active device;
 (c) a second resonant cavity formed to have a dominant mode of operation at the predetermined frequency;
 (d) coupling apparatus for coupling said active device and said first and second resonant cavities, said coupling apparatus including means for supplying operating power to said active device and an equalizing network for adjusting the impedance between said active device and said first and second cavities, and said coupling apparatus being constructed for controlling oscillations in the oscillatory apparatus to the predetermined frequency; and
 (e) output means coupled to said first cavity for removing power therefrom at the predetermined frequency.

13. Oscillatory apparatus as claimed in claim 12 including a plurality of active devices.

14. Oscillatory apparatus for frequencies on the order of microwave, millimeter wave and above, comprising:
 (a) an active device having a negative resistance region of operation;
 (b) a first resonant cavity designed to operate at a higher order made of operation at a predetermined frequency within the region of operation of said active device;
 (c) a second resonant cavity formed to have a dominant mode of operation at the predetermined frequency;
 (d) a section of coaxial line having said active device coupled thereto adjacent one end, said first resonant cavity coupled thereto in spaced relation from said active device, and said second resonant cavity coupled thereto in spaced relation from said first cavity a distance equal to N one-quarter wavelengths of the predetermined frequency, where N is an odd integer;
 (e) an equalizing network mounted in said coaxial line between said active device and said first resonant cavity and constructed so that the impedance of said first and second resonant cavities as seen by said active device are directly proportional to the loading of said first and second cavities, respectively; and
 (f) output means coupled to said first cavity for removing power therefrom at the predetermined frequency.

15. Oscillatory apparatus as claimed in claim 14 wherein the first resonant cavity is a generally cylindrically shaped cavity having additional sections of coaxial line and active devices coupled thereto with the output means coupled thereto in spaced relation from the axis thereof.

* * * * *